(12) United States Patent
Kondo et al.

(10) Patent No.: US 7,858,959 B2
(45) Date of Patent: *Dec. 28, 2010

(54) ELECTRONIC ELEMENT INCLUDING FERROELECTRIC SUBSTANCE FILM AND METHOD OF MANUFACTURING THE SAME

(75) Inventors: Masao Kondo, Sagamihara (JP); Kazuaki Kurihara, Yamato (JP)

(73) Assignee: Fujitsu Limited, Kawasaki (JP)

( * ) Notice: Subject to any disclaimer, the term of this patent is extended or adjusted under 35 U.S.C. 154(b) by 295 days.

This patent is subject to a terminal disclaimer.

(21) Appl. No.: 12/149,962

(22) Filed: May 12, 2008

(65) Prior Publication Data

US 2010/0051891 A1   Mar. 4, 2010

Related U.S. Application Data

(62) Division of application No. 11/093,202, filed on Mar. 30, 2005, now Pat. No. 7,427,515.

(30) Foreign Application Priority Data

Mar. 31, 2004 (JP) .............................. 2004-102990

(51) Int. Cl.
*H01L 29/72* (2006.01)

(52) U.S. Cl. ................ 257/2; 257/76; 257/94; 257/183; 257/184; 117/84; 117/106; 428/446; 428/450; 428/701; 428/702

(58) Field of Classification Search ............. 257/76, 257/94, 183, 184; 117/84, 105; 428/446, 428/450, 701, 702

See application file for complete search history.

(56) References Cited

U.S. PATENT DOCUMENTS 5,188,902 A   2/1993 Lin (Continued)

FOREIGN PATENT DOCUMENTS

JP   09-110592 A   4/1997

(Continued)

OTHER PUBLICATIONS

S. Matsubara et al., *Preparation of epitaxial $ABO_3$ perovskite-type oxide thin films on a (100) $MgAl_2O_4$/Si substrate*, J. Appl. Phys., vol. 66, No. 12, Dec. 15, 1989, pp. 5826-5832.

*Primary Examiner*—Edward Wojciechowicz
(74) *Attorney, Agent, or Firm*—Westerman, Hattori, Daniels & Adrian, LLP

(57) ABSTRACT

A laminated film structure, method of manufacturing, and a preferable electronic element using the structure. The effective polarization into the electric field can be realized in the direction of crystal axis by enhancing the crystal property and alignment property of the ferroelectric substance film formed through epitaxial growth with reference to the plane alignment of semiconductor substrate. After the yttrium stabilized zirconium film and a film of the rock salt structure are sequentially formed with epitaxial growth on a semiconductor substrate, the ferroelectric substance film of simple Perovskite structure is also formed with epitaxial growth. The ferroelectric substance film can improve the crystal property and alignment property thereof by rotating the plane for 45 degrees within the plane for the crystal axis of the yttrium stabilized zirconium.

21 Claims, 13 Drawing Sheets

U.S. PATENT DOCUMENTS

| | | | |
|---|---|---|---|
| 6,027,826 A | 2/2000 | deRochemont et al. | |
| 6,747,317 B2 | 6/2004 | Kondo et al. | |
| 7,368,172 B2 * | 5/2008 | Kondo et al. | 428/446 |
| 2005/0009306 A1 | 1/2005 | Mitani et al. | |

FOREIGN PATENT DOCUMENTS

| | | |
|---|---|---|
| JP | 2003-142479 A | 5/2003 |

* cited by examiner

ELECTRONIC ELEMENT INCLUDING FERROELECTRIC SUBSTANCE FILM AND METHOD OF MANUFACTURING THE SAME

CROSS-REFERENCE TO RELATED APPLICATIONS

This application is a Divisional of application Ser. No. 11/093,202, filed on Mar. 30, 2005, which is based upon and claims the benefit of priority from the prior Japanese Patent Application No. 2004-102990, filed in Mar. 31, 2004, the entire contents of which are incorporated herein by reference.

FIELD OF THE INVENTION

The present invention relates to an electronic element including the ferroelectric substance film which may be suitably adapted to nonvolatile semiconductor memory element, actuator element of micro-machine, sensor element for measuring physical displacement, filter element for communication, and optical switch element.

BACKGROUND OF THE INVENTION

Many oxides in which a crystal structure is the simple Perovskike structure may be used as the material of the ferroelectric substance showing the self-generating polarization resulting in the piezoelectric characteristic, dielectric characteristic, pyroelectric characteristic, electric conductance characteristic, electrostrictive effect, and electro-optical effect, etc.

The ferroelectric substance having such properties may be adapted to an IC card as a semiconductor memory element, an actuator element including a piezoelectric pump structure through ultra-fine-process on a silicon substrate, and to a filter element for communication apparatus for detecting surface acoustic wave (SAW). Moreover, since such ferroelectric substance is an oxide, it has the property to transmit the light and is therefore applied to an optical switch element utilizing change in refractive index (electro-optical effect) which is generated when a voltage is applied thereto.

When the ferroelectric substance is adapted to a 1T/1C type memory element (one capacitance element corresponds to one transistor), it is expected to provide the ferroelectric substance structure which provides the maximum polarization by applying a voltage in the vertical direction of a semiconductor substrate. For this purpose, it is therefore preferable that the ferroelectric substance structure includes an oxide having the simple Perovskite structure of the tetragonal crystal phase in which the residual polarizing direction is aligned in the direction of plane (001).

An oxide having the simple Perovskite structure aligned to the plane (001) can be obtained with the epitaxial growth method. The film obtained by epitaxial growth can be suitably used in an electronic element including the ferroelectric substance film as the film which is aligned not only in the vertical direction to the substrate but also within the substrate.

Moreover, it is also required to suppress production of a silicon oxide film, even if the substrate is in contact with the heated raw material gas, in order to realize epitaxial growth of the desired ferroelectric substance film on the highly flexible silicon single crystal substrate. Therefore, such ferroelectric oxide film is provided on the silicon single crystal substrate using the Yttria-Stabilized Zirconia (hereinafter, referred to as YSZ), magnesium oxide, and magnesia spinnel or the like as the underlayer (See JP-A No. 110592/1997).

In addition, alignment property is controlled by providing a rare earth oxide such as $CeO_2$ on the underlayer provided on the silicon single crystal substrate. (See JP-A No. 110592/1997), also see J. Appl. Phys. 66 (1989) 5826.

SUMMARY OF THE INVENTION

When it is attempted to form, with epitaxial growth, an oxide having the simple Perovskite structure in the direction of plane (001) on the silicon single crystal substrate, misalignment is generated between the crystal lattices of the YSZ film used as the underlayer and the oxide having the simple Perevskite structure formed with epitaxial growth in the direction of plane (001) and thereby the stress generated at the interface will prevent stable formation of the film.

The present invention discloses the art to provide an electronic element including the simple Perovskite structure which is formed with epitaxial growth on the single crystal silicon substrate in the direction of plane (001) by enhancing lattice alignment property.

An oxide of the simple Perovskite structure having higher crystal property can be formed, with epitaxial growth, perfectly in the direction of plane (001) by forming first an epitaxial film which is mainly formed of Zirconium oxide on the (001) single crystal substrate, thereafter forming an intermediate layer of the rock salt structure, and then forming thereon an oxide of the simple Perovskite structure. Moreover, since the alignment effect to the plane (001) can be attained by forming the intermediate layer of the rock salt structure in the thickness of 1.5 nm or more, the intermediate layer of the rock salt structure can be formed as thin as it may be lost through diffusion into the simple Perovskite film. As described above, an oxide of the simple Perovskite structure can be formed in the shape substantially in contact with the epitaxial film mainly formed of Zirconium oxide.

A ferroelectric substance film of the simple Perovskite structure is formed by once forming a thin film having the rock salt structure on the film which is mainly formed of zirconium oxide formed with the epitaxial growth using the plane alignment of the semiconductor substrate and then rotating the plane (001) for 45 degrees for the film mainly formed of the zirconium oxide within the plane for the epitaxial growth in the direction of plane (001) and then diffusing the thin film of the rock salt structure within own film. This is because the mismatch in the lattice parameters is smaller in the 45°-rotated alignment than in the non-rotated alignment. The ferroelectric substance film described above has higher crystal property and ensures higher alignment property within the plane (001).

An electronic device of the ferroelectric substance film structure of the present invention enables the manufacture of various kinds of electronic elements including ferroelectric substances such as a capacitance element and a memory element in which a leak current is reduced because the amount of polarization increases, an actuator element which shows a large amount of displacement, a filter element and an optical switch element resulting in less amount of optical loss.

Through application of the laminated film structure to various electronic elements, a low price electronic device can be provided because an element having higher electric conversion efficiency can be obtained by utilizing an excellent crystal property and moreover an element can also be formed on a large size silicon single crystal substrate.

DETAILED DESCRIPTION OF THE PREFERRED EMBODIMENTS

A preferred embodiment of the present invention will be described below.

Figure 1A:
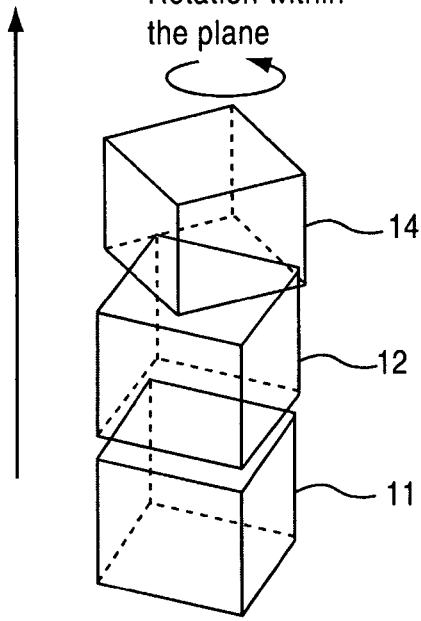
FIGS. 1A and 1B show schematic diagrams illustrating the relationships of alignment of the laminated film structure on the basis of the embodiment of the present invention.
Figure 1B:
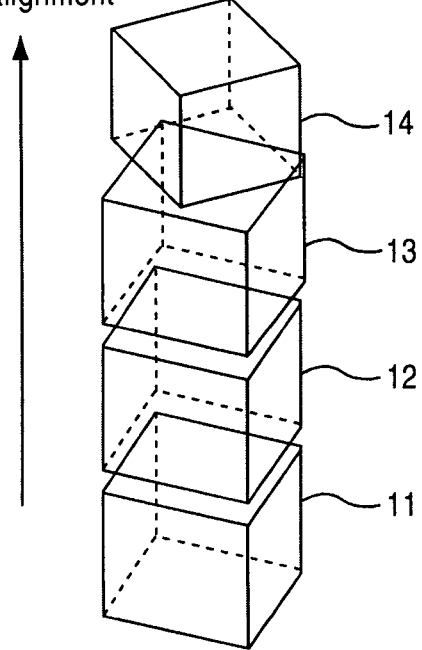

FIGS. 1A and 1B are diagrams for describing the operation principle of the laminated film structure in which the oxide film of the simple Perovskite structure is aligned with the plane (001).

FIG. 1A is a schematic diagram for describing alignment in the plane of each film of the laminated film structure including the ferroelectric substance film. As illustrated in the figure, after the zirconium oxide 12 is formed with the epitaxial growth method on the (001) silicon single crystal substrate (hereinafter, abbreviated as silicon substrate) 11, a thin film of the rock salt structure (not illustrated) is formed. Next, an oxide 14 of the simple Perovskite structure is formed with the epitaxial growth method. Through the epitaxial growth of the oxide 14 of the simple Perovskite structure, the thin film of the rock salt structure is lost. Simultaneously, the oxide 14 of the Perovskite structure is grown through rotation within the plane (001) for the zirconium oxide 12.

FIG. 1B is a schematic diagram for describing alignment in the plane of each film of the other laminated film structure including the ferroelectric substance film. Different from A of FIG. 1 is that a film 13 of the rock salt structure is left within the laminated film structure on the zirconium oxide 12. Even with the method described above, the oxide 14 of the simple Perovskite structure, which has been grown through rotation within the plane (001) for the zirconium oxide 12, can also be laminated.

The manufacturing processes of the laminated film structure illustrated in FIG. 1A will be described with reference to FIGS. 2A to 2D.

FIGS. 2A to 2D are diagrams for describing the common manufacturing processes (A to D) of the laminated film structure on the basis of an embodiment of the present invention. For the details of the materials and manufacturing processes when the laminated film structure is adapted to individual electronic element, refer to each embodiment described later.

Figure 2A:
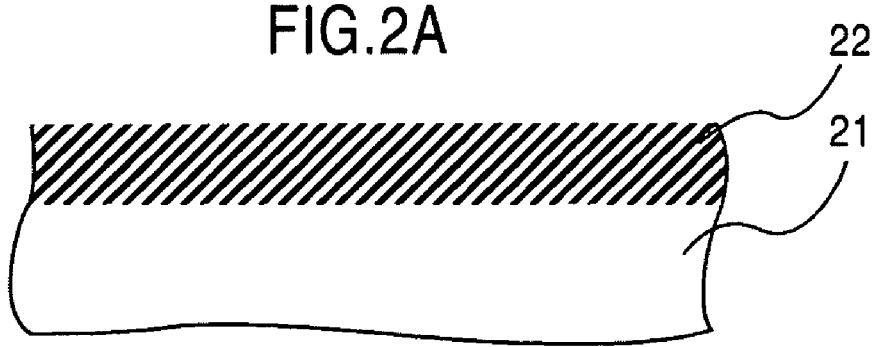
FIGS. 2A to 2D show schematic diagrams for describing the processes to form the laminated film structure on the basis of the embodiment of the present invention.

A zirconium oxide film 22 is grown with epitaxial growth on a silicon substrate 21 to form the structure illustrated in FIG. 2A.

Figure 2B:
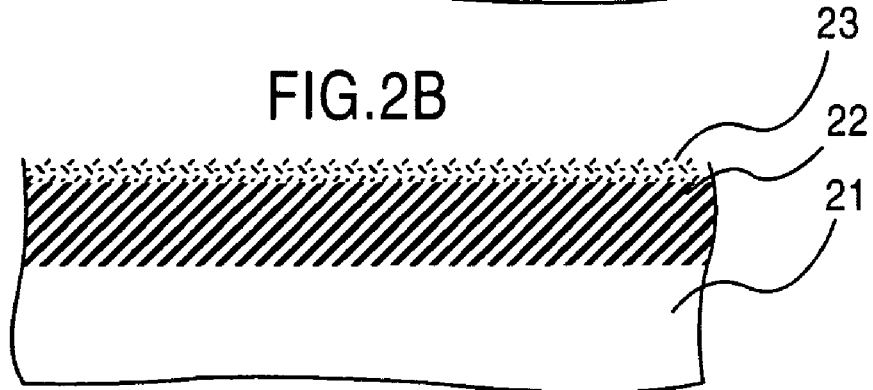
Figure 2C:
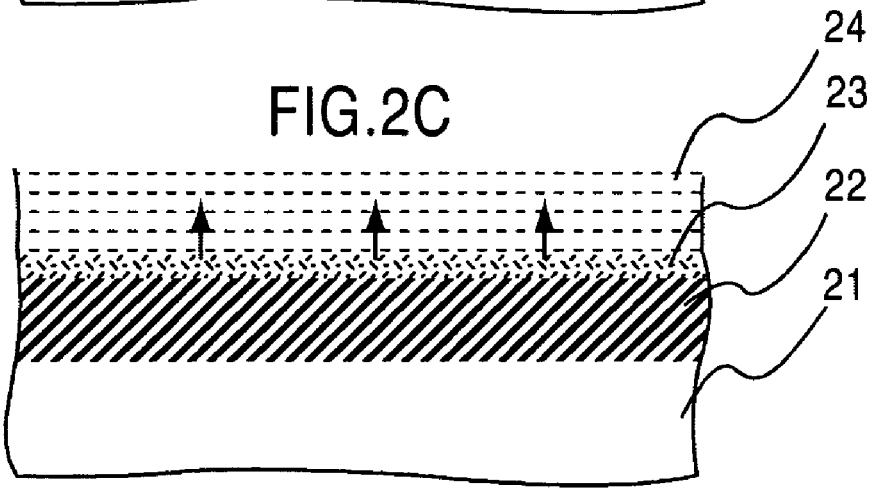

Next, a film 23 of the rock salt structure is formed with epitaxial growth, for example, as a strontium oxide film (hereinafter, described as SrO) in the thickness of several nm, thicker than 1.5 nm or more to form the structure of FIG. 2B.

Thereafter, when an oxide film 24 of the simple Perovskite structure is formed with epitaxial growth, for example, as the strontium titanate (hereinafter described as $SrTiO_3$), the film 23 of the rock salt structure is diffused into the crystal lattice of the oxide film 24 of the simple Perovskite structure due to the thermal effect in the film. (Refer to FIG. 2C.)

Figure 2D:
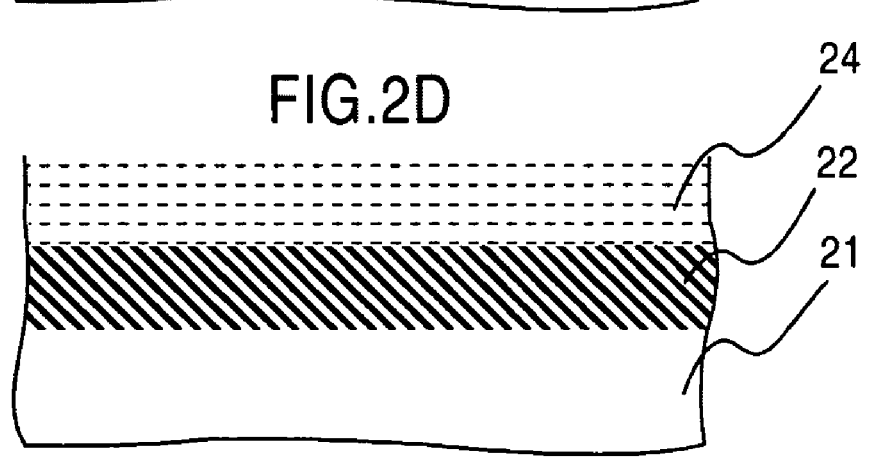

As described above, the film 23 is formed substantially in contact with the zirconium oxide film 22 with the oxide film 24 of the simple Perovskite structure working as the (001) alignment film to form the structure of FIG. 2D.

The zirconium oxide film 22 shows the tetragonal phase under high temperature environment and the monoclinic phase under the room temperature environment, resulting in the phase transfer under the cooling process. When the volume of the film changes with this phase transfer, the film is peeled off. In order to obtain the zirconium oxide film of the stabilized cubic phase, it is possible to add the rare earth oxide including scandium or yttrium and alkaline earth metal oxide.

Figure 3A:
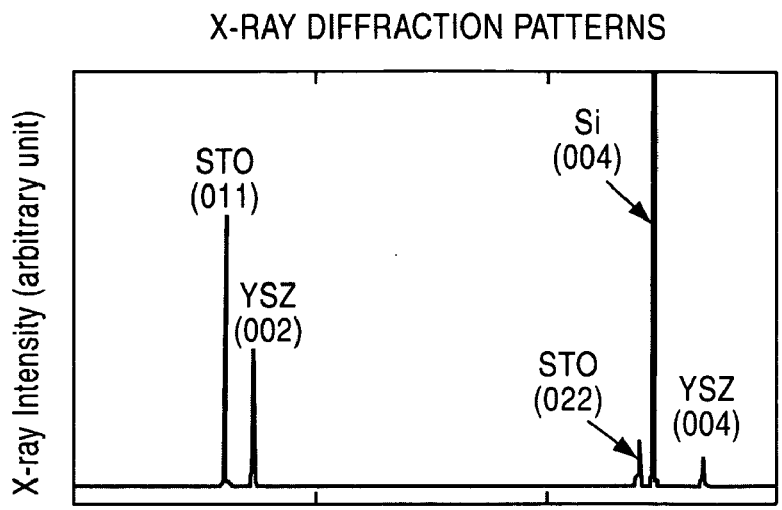
FIGS. 3A to 3C show X-ray diffraction patterns of the laminated film structure of the embodiment of the present invention and that of the prior art.
Figure 3B:
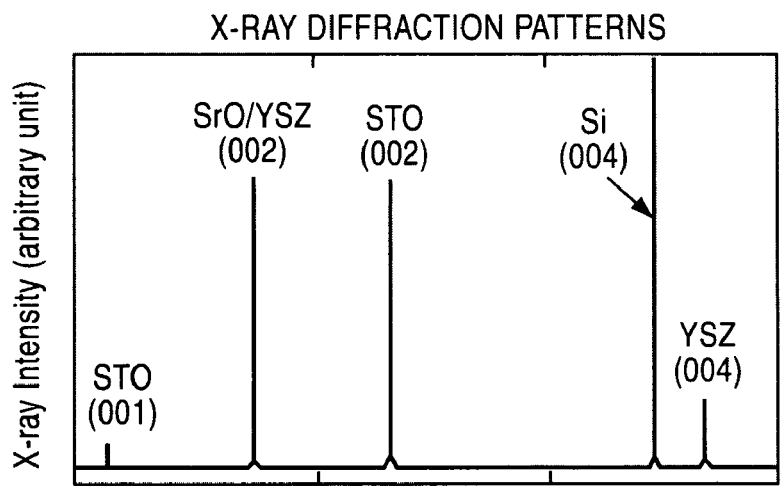
Figure 3C:
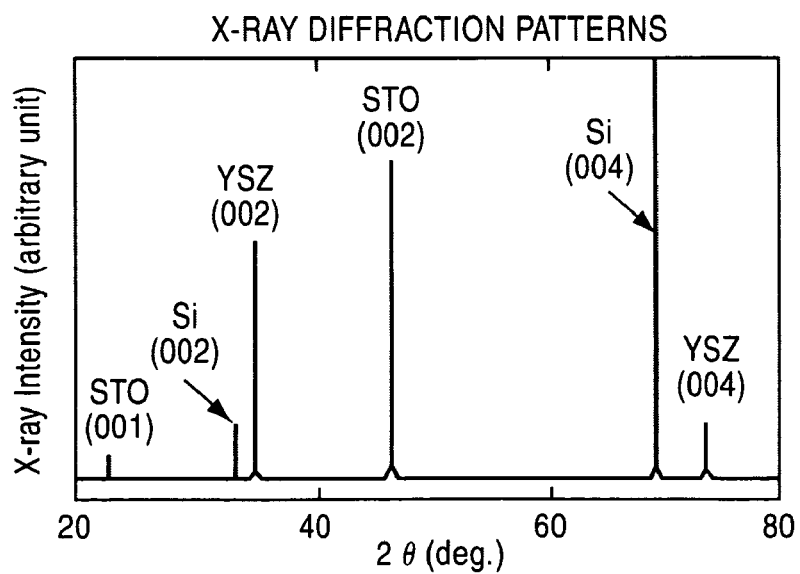

FIGS. 3A to 3C illustrate respectively the X-ray diffraction patterns indicating the alignment property of the ferroelectric substance film on the basis of one embodiment of the present invention and the alignment property of the ferroelectric substance film manufactured with the method of prior art. FIGS. 3A, 3B, and 3C respectively illustrate the X-ray diffraction patterns (A, B, C) of the three analyzing samples with the scanning angle of the lateral axis unified in view of showing the positional relationships of the peaks appearing in each angle.

FIG. 3A illustrates the X-ray diffraction pattern (2θ-θscanning) of the laminated film structure obtained by forming an YSZ film on the silicon substrate with the epitaxial growth method and then forming an SrTiO$_3$ film with the epitaxial growth method. In comparison with the sample of FIG. 3A, FIG. 3B is the X-ray diffraction pattern of the laminated film structure obtained by forming, with epitaxial growth, the SrTiO$_3$ films in both sides of the SrO film of the rock salt structure with the interval of 30 nm on the YSZ film. In comparison with the laminated film structure used in FIG. 3B, FIG. 3C is the X-ray diffraction pattern of the laminated film structure which is different in the point that after the SrO film is formed in the thickness of 2 nm, the SrO film is diffused into the SrTiO$_3$ film as the upper film.

FIG. 3A illustrates that the SrTiO$_3$ film has the peak in the alignment of plane (011) and (022) and does not show any alignment in the plane (001). In FIG. 3B, only the peaks in the alignment in the planes (004) of the silicon substrate, plane (004) of the YSZ film, and planes (002) and (001) of the SrTiO$_3$ film can be observed. This means that all thin films are aligned in the plane (001) because the peak indicating diffraction of the index number of the planes (011) and (111) is not observed. Since the lattice constants of the YSZ film and SrO film are approximated with each other to about 5.1 Å, the lattice constant is observed as one peak in this analysis. FIG. 3C indicates that the SrTiO$_3$ film aligned to the plane (001) can be obtained with the result which is similar to that of FIG. 3B.

Figure 4:
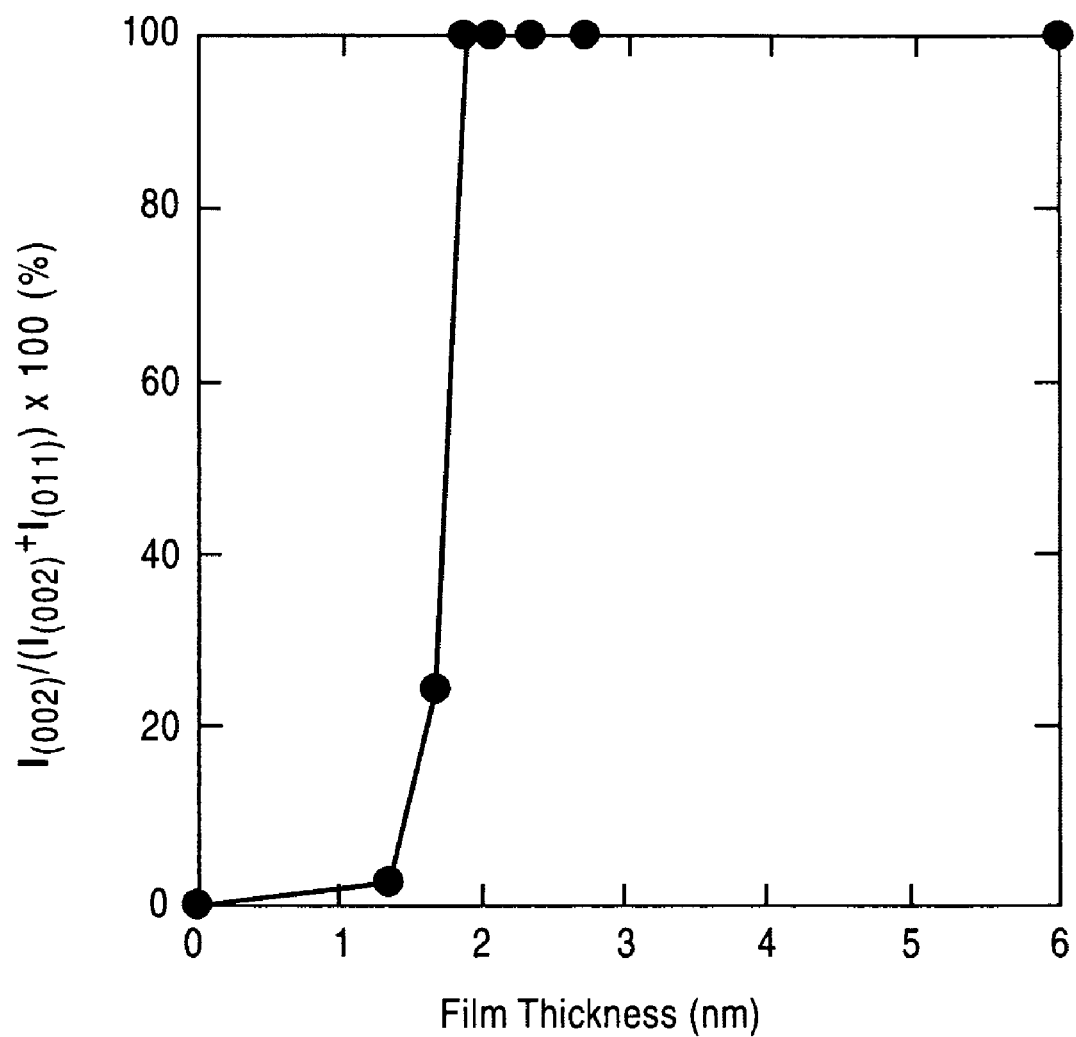
FIG. 4 shows the relationship between the alignment coefficient of the simple Perovskite film on the basis of the embodiment of the present invention and the thickness of the underlayer film.

FIG. 4 illustrates the alignment coefficient to the plane (001) of the SrTiO$_3$ film for the thickness of the SrO film in the laminated film structure on the basis of this embodiment of the present invention.

The alignment coefficient plotted on the vertical axis in the figure is defined as the percentage of $I(002)/(I(002)+I(011))$. However, $I(002)$ indicates the integral intensity of the (002) peak due to the X-ray diffraction pattern of the SrTiO$_3$ film, while $I(011)$, the integral intensity of the (011) peak of the same film. Accordingly, 0% of the vertical axis means the perfect alignment to the plane (011) and 100%, the perfect alignment to the plane (001). From this figure, it can be understood that the alignment coefficient to the plane (001) is rapidly increasing from the thickness of about 1.5 nm of the SrO film. When the film including the rock salt structure such as the SrO film exists on the YSZ film as described above, the oxide including the simple Perovskite structure such as the SrTiO$_3$ film is suppressed in the alignment to the plane (011) and increases in the alignment element to the plane (001).

Figure 5:
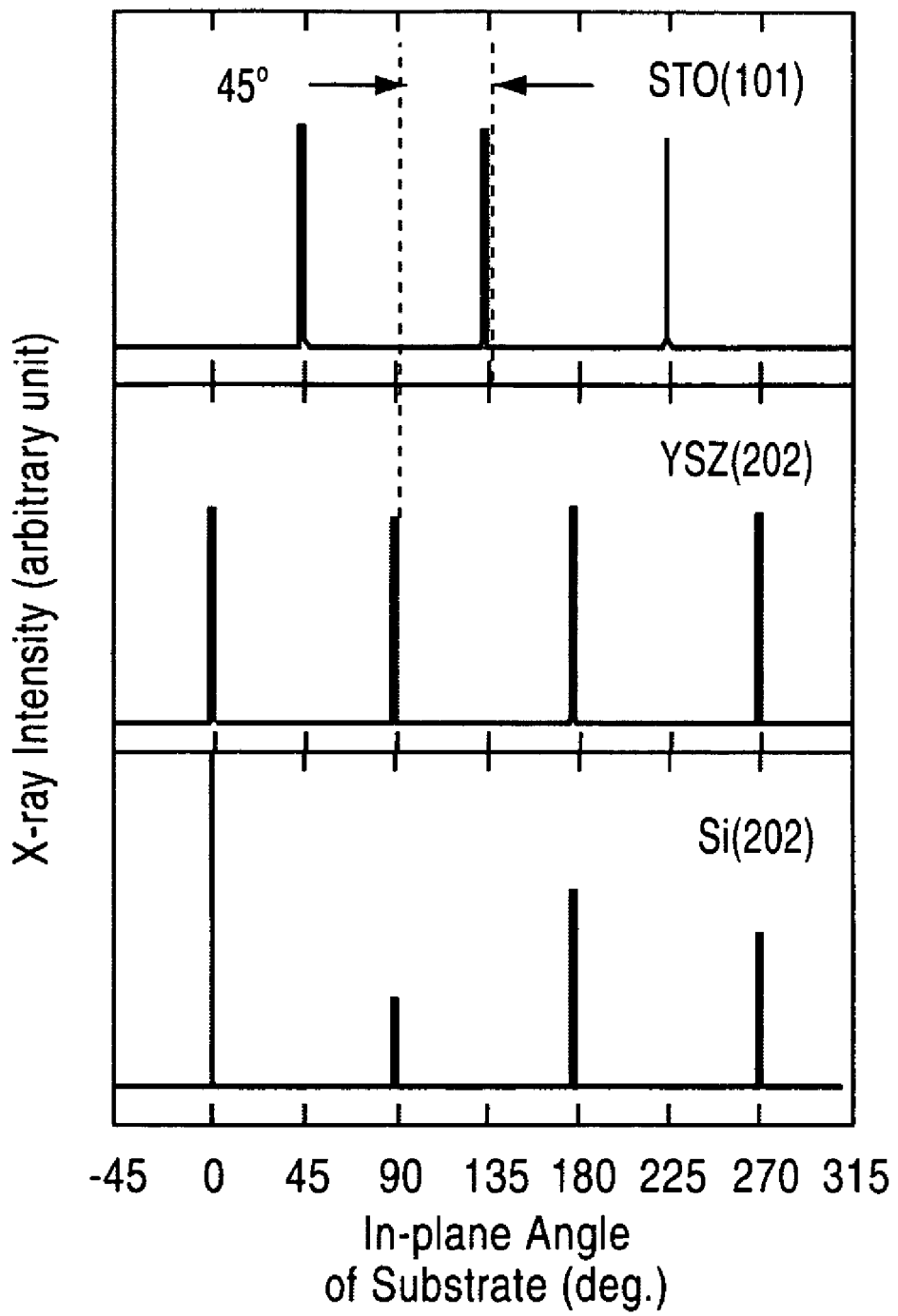
FIG. 5 shows an X-ray diffraction pattern within the plane of the laminated film structure on the basis of the embodiment of the present invention.

FIG. 5 illustrates the X-ray diffraction pattern (φ scanning) of the laminated film structure including the ferroelectric substance. The laminated film structure for the analysis has been obtained by forming the YSZ film, with epitaxial growth, on the silicon substrate and thereafter forming the SrTiO$_3$ film including the simple Perovskite structure on the intermediate layer in which the SrO film including the rock salt structure is diffused to the upper layer in the subsequent process.

At each peak of the X-ray diffraction pattern of the laminated film structure, the plane (202) of the silicon substrate, (202) of the YSZ film, and (101) of the SrTiO$_3$ film have respectively obtained as the four peaks (in the SrTiO$_3$ film, one peak exists at the angle of −45 degrees within the substrate). It means there are four symmetrical points and all thin films are formed, with epitaxial growth, in the alignment to the plane within the substrate. At each peak point, the plane (101) of the SrTiO$_3$ film is deviated by 45 degrees in the peak appearing angle for the plane (202) of the silicon substrate and YSZ film. It indicates that the plane (001) of the SrTiO$_3$ film rotates for 45 degrees within the plane and grows in the direction of the plane (001).

As an example of adjustment in the alignment of plane, behavior of the SrTiO$_3$ film in which the underlayer becomes the YSZ film has been indicated, but the oxide including the simple Perovskite structure can be formed, with epitaxial growth, via the intermediate layer including the structure selected to rotate the crystal axis for the desired angle even when the underlayer is a film other than the YSZ film.

Figure 6:
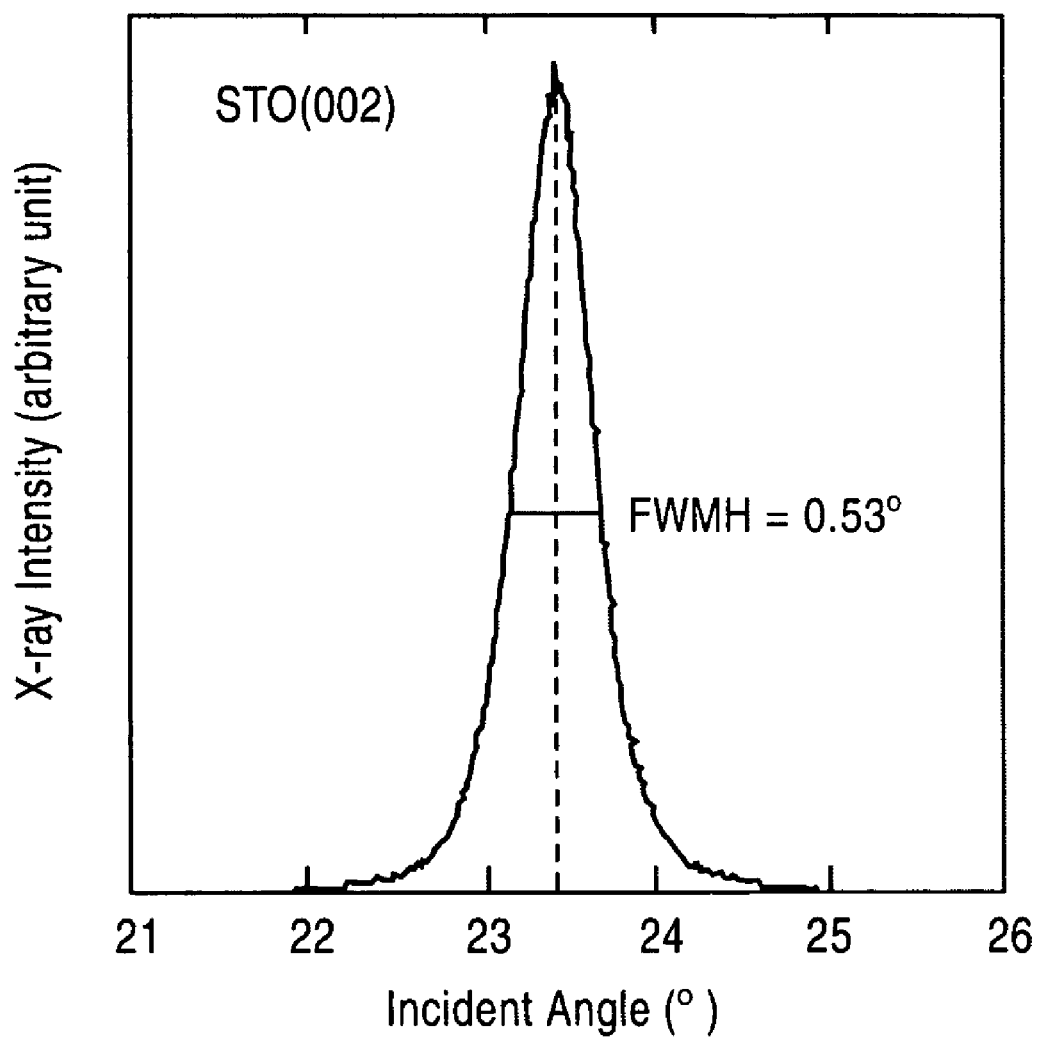
FIG. 6 shows a locking curve obtained through the X-ray diffraction analysis of the laminated film structure on the basis of the embodiment of the present invention.

FIG. 6 illustrates a θ-locking curve at the (002) peak obtained by the X-ray diffraction analysis of the SrTiO$_3$ film. The laminated film structure used for the analysis is identical to that used for the analysis in FIG. 5.

The peak of the X-ray intensity becomes the maximum when the incident angle of the X-ray is about 23.4 degrees, the half-value width of the peak in this angle is 0.53 degrees, indicating that the crystal property is very high. This result has been obtained through improvement in the lattice matching property which can be attained because the plane (001) of the SrTiO$_3$ film grows through rotation of 45 degrees within the plane for the zirconium oxide.

The crystal property of the oxide including the simple Perovskite structure is evaluated through comparison of the half-value width of the X-ray diffraction peak. Namely, the half-value width is given as the peak width in the intensity equal to a half of the peak top with reference to the locking curve which can be obtained by fixing the diffraction angle (2θ) of the X-ray peak and then scanning the incident angle (θ). This value can be used as an index indicating a tilting degree of the direction of crystal in the film from the vertical direction of the substrate. When such index is smaller, the single crystal which is closer to the ideal crystal can be obtained. Moreover, when such half-value width becomes 1 degree or less, the more practical crystal property can be attained.

Next, an embodiment in which the laminated film structure described above is adapted to an electronic element will then be described.

As the first embodiment, a capacitance element will be described.

Figure 7A:
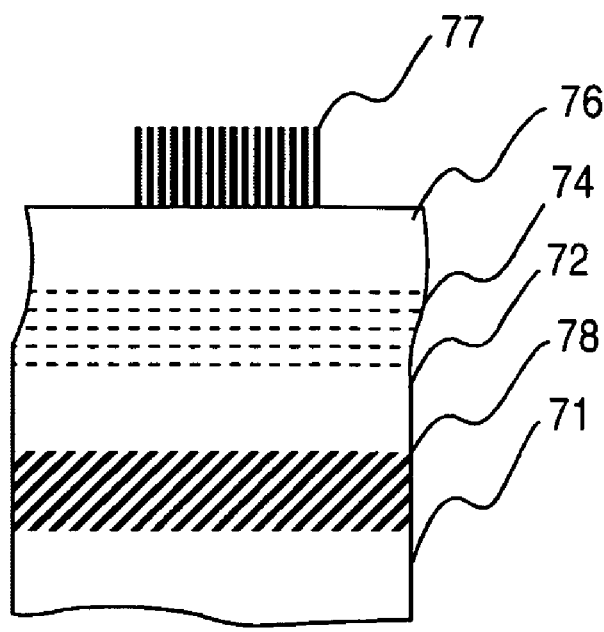
FIGS. 7A and 7B show schematic cross-sectional views of the electronic element to which the laminated film structure on the basis of the embodiment of the present invention is adapted.

FIG. 7A is a schematic cross-sectional view of the essential portion of the capacitance element.

This capacitance element has a structure that a Pt electrode 77 is provided to the laminated film structure in which a silicon oxide film 78 (thickness: 100 nm), a YSZ film 72 (thickness: 200 nm), a strontium ruthenium oxide where the SrO is diffused (hereinafter, described as SrRuO$_3$) 74 (thickness: 100 nm) and a lead zirconate titanate (hereinafter PZT) film 76 (thickness: 400 nm) are laminated on a silicon substrate 71.

This capacitance element has been formed with the following manufacturing method.

After an organic substance is removed, with the known cleaning means, from the surface of silicon substrate 71, this silicon substrate 71 is soaked into the diluted hydrofluoric acid of 9% to remove the naturally oxidized film at the surface of substrate.

The substrate is maintained under the temperature of 650 degree C. within the chamber evacuated to 0.5 mTorr. Thereafter, the YSZ film 72 is formed with epitaxial growth by irradiating the YSZ target with the KrF excimer laser for 10 minutes (pulse oscillation), while the oxygen gas (12 cc/min) is introduced (hereinafter, described as the pulse laser deposition (PLD) method).

Next, the heat treatment is conducted using an electric furnace (1050 degree C., 2 hours) under the vapor environment (atmospheric condition) using the oxygen gas (1000 cc/min) as the carrier gas to form a silicon oxide film 78 between the YSZ film 72 and the silicon substrate 71. Thereby, the YSZ film 72 having improved the crystal property can be obtained.

Thereafter, the heating process (650 degree C.) is maintained within the chamber evacuated for the substrate (10 mTorr). While the oxygen gas is introduced (6 cc/min) the strontium carbonate target is then irradiated (one minute) with the KrF excimer laser with the pulse laser deposition method for the growth of the SrO film (not illustrated) on the YSZ film 72 with the epitaxial growth method.

Next, the heating condition (650 degree C.) is maintained within the chamber evacuated (200 mTorr) for the substrate. Thereafter, while the oxygen gas is introduced (6 cc/min), the SrRuO$_3$ film 74 is formed, with epitaxial growth, to the SrO film by irradiating (10 minutes) the target of strontium ruthenium oxide with the KrF excimer laser by the pulse laser deposition method. The SrRuO$_3$ film 74 is rotated for 45 degrees in the plane (001) for the YSZ film 72 and realizes diffusion of the SrO film.

Next, the heating condition is maintained at 650 degree C. within the chamber evacuated (200 mTorr) for the substrate. Thereafter, while the oxygen gas is introduced (6 cc/min), the PZT film 76 is formed with epitaxial growth on the SrRuO$_3$ film 74 by irradiating (10 minutes) the PZT 52/48 target (Pb(Zr$_{0.52}$Ti$_{0.48}$)O$_3$) with the KrF excimer laser with the pulse laser deposition method.

Next, the Pt electrode 77 (thickness: 150 nm) is formed with the sputtering method (temperature: room temperature; pressure: 7.5 mTorr; flow rate of argon gas: 30 cc/min) in the manner covering the laminated film structure with a metal stencil mask, for example, of the circular plane shape.

Next, the heat treatment is conducted (600 degree C., one hour using an electric furnace) by introducing the oxygen gas under the atmospheric condition (5000 cc/min). With this heat treatment, the crystal defect of the PZT film 76 caused by the sputtering method can be recovered.

The capacitance element illustrated in FIG. 7A can be obtained as described above.

Next, a memory element will be described as the second embodiment.

Figure 7B:
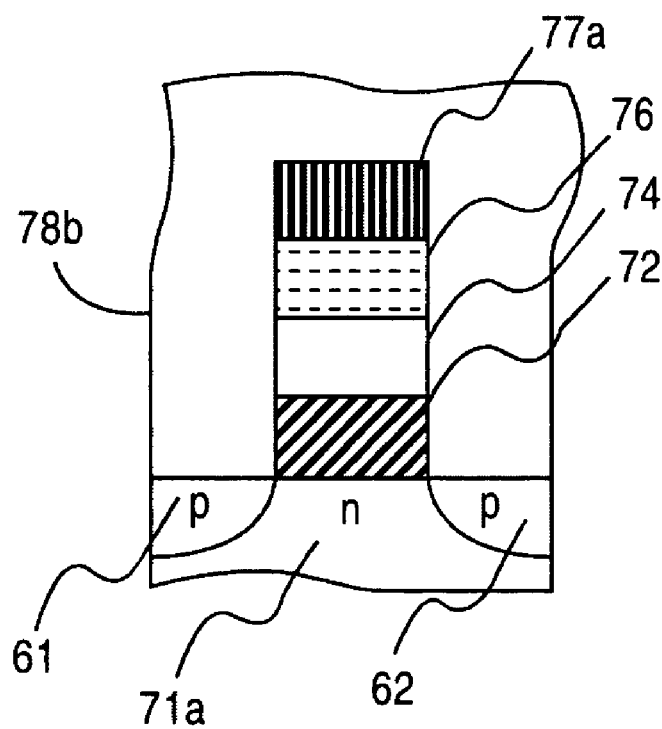

FIG. 7B is a schematic cross-sectional view of the essential portion of a cell structure of the memory element.

As illustrated in FIG. 7B, the MFIS (Metal/Ferroelectric/Insulator/Semiconductor) structure covered with an insulation film 78b is formed by providing, as an impurity diffused layer, a SrTiO$_3$ film 74/YSZ film 72 substituted for a transistor gate oxide film on the silicon substrate 71a provided with the source 61/drain 62 and moreover laminating thereon a ferroelectric substance film 76 and an upper electrode 77a.

This structure can be formed by replacing a part or the entire part of the gate oxide film included in a semiconductor gate electrode structure with the ferroelectric substance film.

For the read operation of cells, change in the threshold value of transistor (conductance of the current flowing through the source 61/drain 62) is used. This change is generated in accordance with the polarizing direction as a result of polarizing inversion of the ferroelectric substance film generated when a voltage is applied across the gate electrode 77a and substrate 71a. Namely, when the predetermined gate voltage is applied, amplitude of the drain current changing in accordance with the polarizing direction can be recognized as the cell information.

Next, the manufacturing processes of the memory element illustrated in FIG. 7B will be described with reference to FIGS. 13A, 13B and FIGS. 14A, 14B.

Like the method described in regard to the first embodiment, a YSZ film 72 (thickness: 10 nm) and a SrO film (thickness: 2 nm, not illustrated) are sequentially formed on an n-type silicon substrate 71a. Next, an SrTiO$_3$ film 74 (thickness: 10 nm) is also formed by selecting the point where the target material is changed to the SrTiO$_3$ to the area different from that in the first embodiment.

However, the silicon substrate 71a includes an element isolating region not illustrated.

Figure 13A:
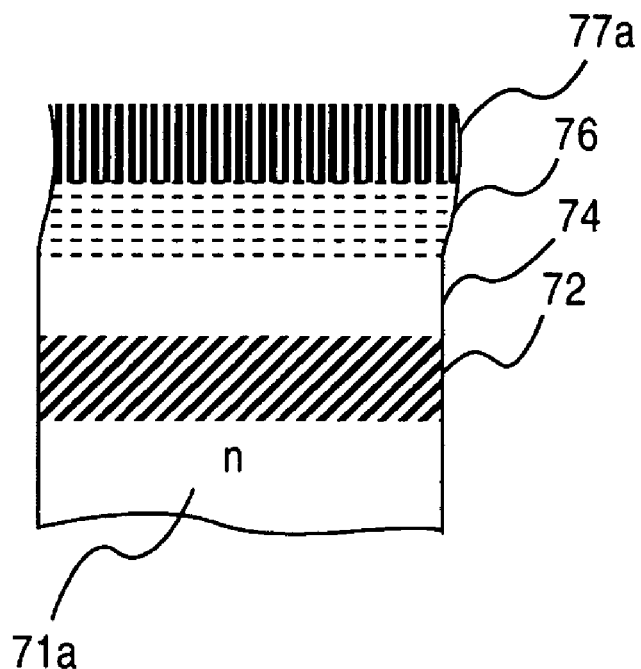
FIGS. 13A and 13B show schematic cross-sectional views of processes in which the laminated film structure on the basis of the embodiment of the present invention is adapted to a memory element.
Figure 13B:
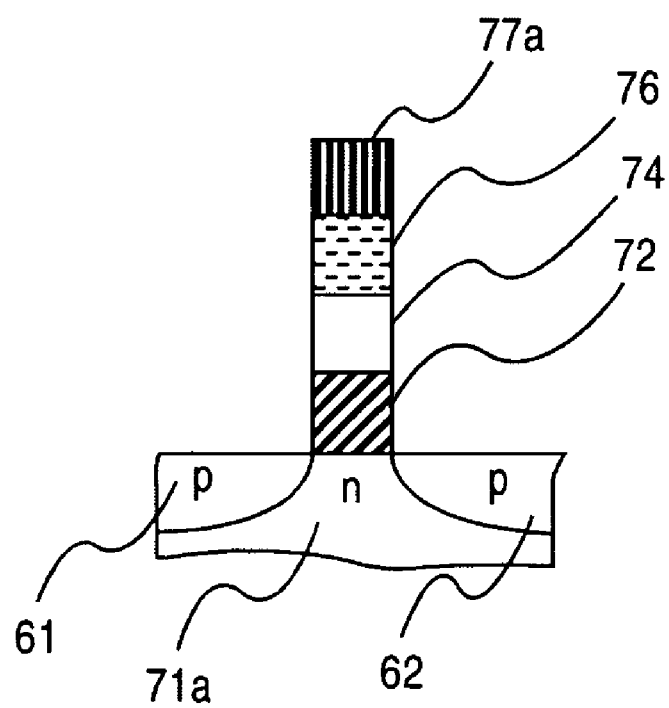

Next, like the first embodiment, the PZT film 76 (thickness: 400 nm) is formed and thereafter the platinum 77a (thickness: 200 nm) is formed with the electron beam deposition method to obtain the structure of FIG. 13A.

The SrTiO$_3$ film 74 is aligned to the plane (001) because the SrO film is diffused.

An impurity for threshold value adjustment of the channel region is doped into the silicon substrate 71a, but variation of the threshold value can be suppressed through prevention of diffusion of impurity by providing an SiN film with the plasma CVD method to the surface of substrate.

Next, a gate electrode structure is formed with the plasma etching method using a resist (not illustrated) patterned into the shape of gate electrode as the mask. First, the gate electrode 77a is etched by the reactive ion etching method using the Ar gas and Cl$_2$ gas as the etching gases. Next, the PZT film 76, SrTiO$_3$ film 74 and YSZ film 72 are sequentially etched with the sputter etching method mainly using Ar as the etching gas. Thereafter, using the gate structure obtained as the mask, ion injection is conducted to the element region. As a result, the source 61/drain 62 region is formed to obtain the structure of FIG. 13B.

As the impurity ion, the B atoms are injected ($1\times10^{14}$/cm$^2$). In this case, contamination by carbon at the surface of the silicon substrate 71a is preferably prevented when the ion injection is conducted by adequately adjusting the acceleration voltage under the condition that the YSZ film 72 is left.

Moreover, when the gate structure is formed in a fine gate structure with accompaniment of the short-channel effect, it is also possible that the impurity ion is implanted in the shallow depth before the ion implantation, and the SiN film is deposited with the known method to the wall side of the gate structure. Accordingly, the LDD (Lightly Doped Drain) may be formed to the gate structure.

Next, the silicon oxide film 78b is formed with the plasma CVD method covering the gate structure. Thereafter, contact holes 79 are formed on the source 61/drain 62 region and the wiring on which the gate electrode is extended (not illustrated) for embedding of the metal plug. In more detail, the silicon oxide film 78b is etched with the plasma etching method using the resist patterned into the shape of contact hole (not illustrated) as the mask. For the etching reaction, the sputtering effect mainly utilizing the Ar gas is considered.

When the insulating film 78b is influenced by the height of the gate electrode structure resulting in deterioration of the size accuracy of the contact hole 79, it is also possible to add the process for flattening the surface of insulating film with the CMP (Chemical Mechanical Polishing) method.

With the evacuated CVD method, tungsten (W) is embedded as a contact plug 80 for attaining continuation to the source 61/drain 62 and the wiring extended from the gate electrode (not illustrated).

The contact plug 80 can selectively be embedded to the contact hole with the CMP process using the SiN film formed previously on the insulating film as the stopper. In order to prevent diffusion of the contact plug material, Ti and TiN can be provided at the internal wall of the contact hole.

Figure 14A:
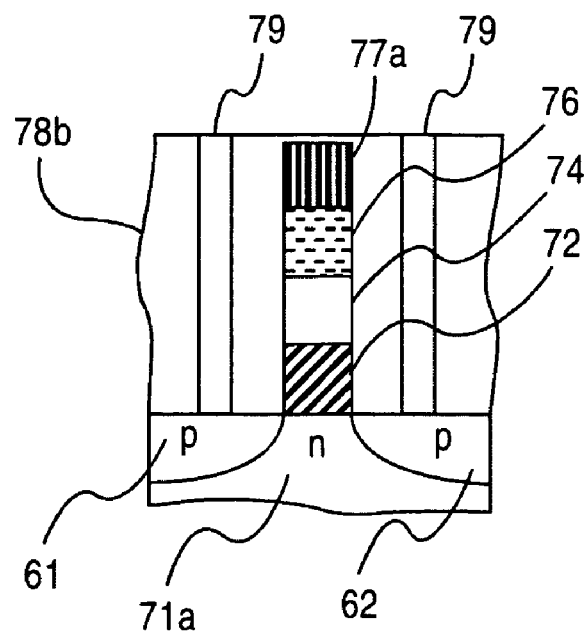
FIGS. 14A and 14B show schematic cross-sectional views of processes in which the laminated film structure on the basis of the embodiment of the present invention is adapted to the memory element.
Figure 14B:
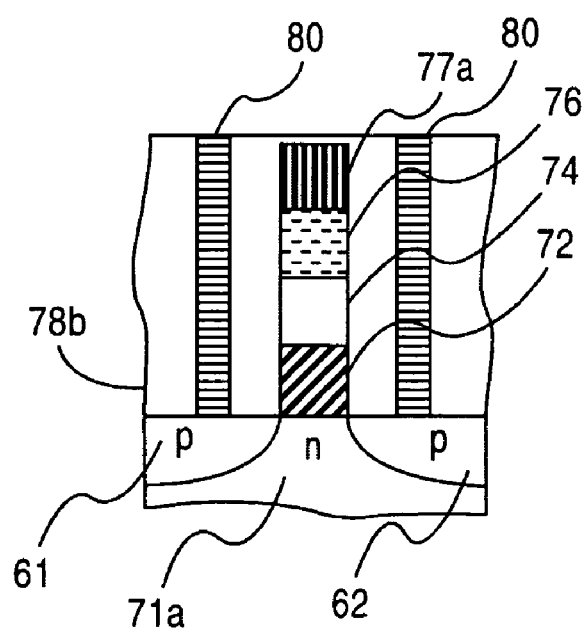

The structure of FIG. 14B can be obtained as described above.

Various materials such as PZT, $(Ba_xSr_{1-x})TiO_3$ ($0 \leq x \leq 1$), $(Pb_{1-y}La_{3/2y})(Zr_{1-x}Ti_x)_3$ ($0 \leq x, y \leq 1$) can be used as the ferroelectric substance material included in the laminated structure. Moreover, an additive is added to the PZT and the polarizing characteristic can be improved with the compositions such as $(Pb_{1-y}La_{3/2y})(Zr_{1-x}Ti_x)O_3$ ($0 \leq x, y \leq 1$), $Pb(B'_{1/3}B''_{2/3})_xTi_yZr_{1-x-y}O_3$ ($0 \leq x, y \leq 1$, B' is a bivalent transition metal, B'' is a pentavalent transition metal), $Pb(B'_{1/2}B''_{1/2})_xTi_yZr_{1-x-y}O_3$ ($0 \leq x, y \leq 1$, B' is a trivalent transition metal, B'' is a pentavalent transition metal), $Pb(B'_{1/3}B''_{2/3})_xTi_yZr_{1-x-y}O_3$ ($0 \leq x, y \leq 1$, B' is a hexavalent transition metal, B'' is a trivalent transition metal).

Since the Perovskite film can be easily grown with epiaxial growth on the Perovskite film, these films may be utilized as the multiple layer.

The ferroelectric substance film included in the gate structure can be polarized and the information can also be stored thereto by respectively controlling the potentials of the plug conductive to the source 61/drain 62, plug (not illustrated) connected to the gate electrode and the silicon substrate 71 formed as described above.

First, the ferroelectric substance film 76 is polarized to set the condition of data "0" (the information is erased) by applying the power supply voltage as the potential in the side of the silicon substrate 71a, grounding the gate electrode 77a, and then floating the potential of the source 61/drain 62.

The data "1" can be written through the polarization by setting the potential of the source 61/drain 62 to about a half of the power supply voltage and then giving a voltage which is lower than that of the source 61/drain 62 to the gate electrode 76.

The data can be read by recognizing the data "1" when a current flows by setting the voltage of drain 62 to about a half of the power supply voltage, setting the gate electrode to the power supply voltage and then setting the voltage of the source 61 to the ground voltage and then recognizing the data "0" when the current does not flow.

Next, an actuator element will be described as the third embodiment.

Figure 8A:
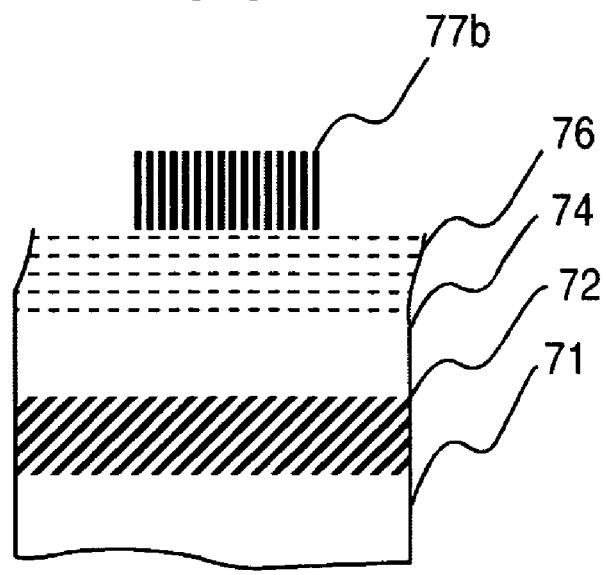
FIGS. 8A and 8B show schematic cross-sectional views of the electronic element to which the laminated film structure on the basis of the embodiment of the present invention is adapted.
Figure 8B:
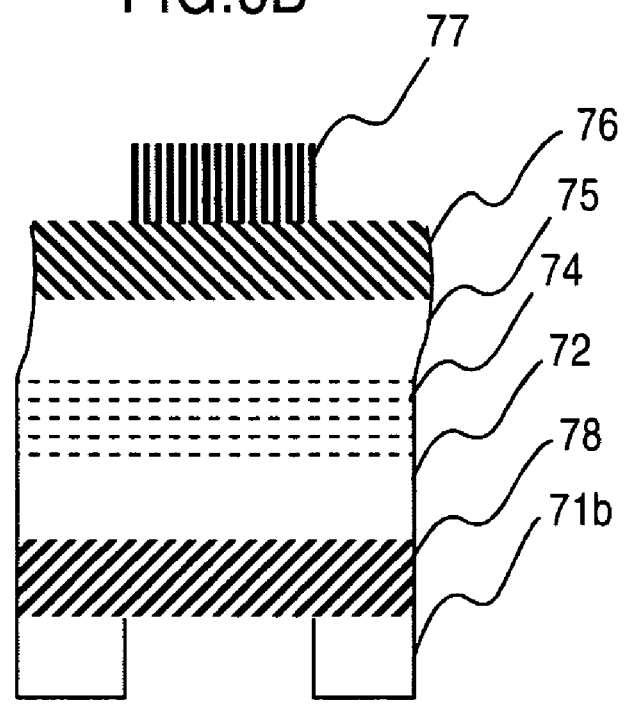

FIG. 8B is a cross-sectional view of the essential portion of the actuator element.

The actuator element has a structure that a Pt electrode 77 is provided on a substrate where a silicon oxide film 78 (thickness: 100 nm), a YSZ film 72 (thickness: 200 nm), a $SrTiO_3$ film 74 where SrO is diffused (thickness: 200 nm), a Pt film 75 (thickness: 200 nm), and a PLZT $(PbLa_{0.015}Zr_{0.45}Ti_{0.55}O_3)$ film 76 (thickness: 300 nm) are laminated on the silicon substrate 71b finally formed in the form of a frame with the final process.

In order to obtain such actuator element, the following manufacturing method is adapted.

First, the silicon oxide film 78 (thickness: 100 nm), YSZ film 72 (thickness: 200 nm) are formed, with the processes identical to that of the first embodiment, on the silicon substrate 71b which is not processed in the shape of a frame. Thereafter, the SrO film (thickness: 2 nm) is then grown on the upper surface thereof.

Next, the heating condition is maintained at 650 degree C. within the chamber evacuated (10 mTorr or less) for the substrate. Thereafter, while the oxygen gas is introduced (6 cc/min), the $SrTiO_3$ film 74 is formed with epitaxial growth on the SrO film (not illustrated) by irradiating the target of strontium titanate with the pulse laser deposition method. The $SrTiO_3$ film 74 is rotated for 45 degrees at the plane (001) for the YSZ film 72, allowing diffusion of the SrO film.

An oxide itself may be used as the target for the growth of an alkali-earth metal oxide such as the strontium oxide film with the pulse laser deposition method. In this case, the oxide is preferably used in the form of carbonate because it is stabilized in the atmospheric condition. Moreover, when a film is formed using the heated target while oxygen is applied in view of accelerating decomposition of the carbonate, the film having further improved crystal property can be obtained.

Next, the heating condition is maintained (600 degree C.) within the chamber evacuated (7.5 mTorr) for the silicon substrate 71b. Thereafter, while argon gas (30 cc/min) and oxygen gas (1 cc/min) are introduced, the Pt film 75 is formed on the $SrTiO_3$ film 74 with the epitaxial growth method with the sputtering method using the platinum target.

Next, the PLZT film 76 is formed with the sol-gel method. First, the PLZT sol-gel solution (composition: PLZT113/1.5/45/55) is dropped (0.3 cc) and it is then spin-coated. Thereafter, the substrate is heated on the hot plate (350 degree C.) to vaporize the solvent. Thereafter, the substrate is cooled up to the room temperature. This spin-coating method is repeated for four times to form the PLZT film 76.

Next, the substrate is heated by furnace at 650° C. for 10 minutes and the PLZT film is crystallized.

Next, the Pt electrode 77 is formed as in the case of the first embodiment.

Next, in view of forming the rear surface of the silicon substrate 71b like a frame, an aperture masked with the resist is coated with the saturated potassium hydroxide heated up to 80 degree C. and the silicon single crystal substrate is wet-etched in the anisotropic condition.

Next, the substrate is annealed as in the case of the first embodiment. This annealing may be executed before the above wet-etching process and the process can be selected in order to protect the frame from distortion. As described above, the actuator element of FIG. 8B can be obtained.

When a lower electrode is required for the laminated film structure, the lower electrode may be formed on the YSZ film using an electrically conductive oxide such as $SrRuO_3$, $CaRuO_3$, $LaNiO_3$, $(La_xSr1-x)CoO_3$ ($0 \leq x \leq 1$), $(La_xSr1-x)MnO_3$ ($0 \leq x \leq 1$) or an insulating film of the simple Perovskite structure such as the $SrTiO_3$ is formed on the YSZ film and a platinum group film such as platinum and iridium films may be formed thereon with epitaxial growth.

Next, a surface elastic wave filter will be described as the fourth embodiment.

FIG. 8A is a schematic cross-sectional diagram of the essential portion of the surface elastic wave filter.

This filter element has a structure that the Pt electrode 77b is provided on the laminated film structure which has been formed by sequentially laminating, on the silicon substrate 71, a YSZ film 72 (thickness: 200 nm), a $SrTiO_3$ film 74 in which SrO is diffused (thickness: 200 nm), and a PLZT film 76 (thickness: 200 nm). However, the Pt electrode 77b has the electrode structure having the comb-shape plane.

Figure 9:
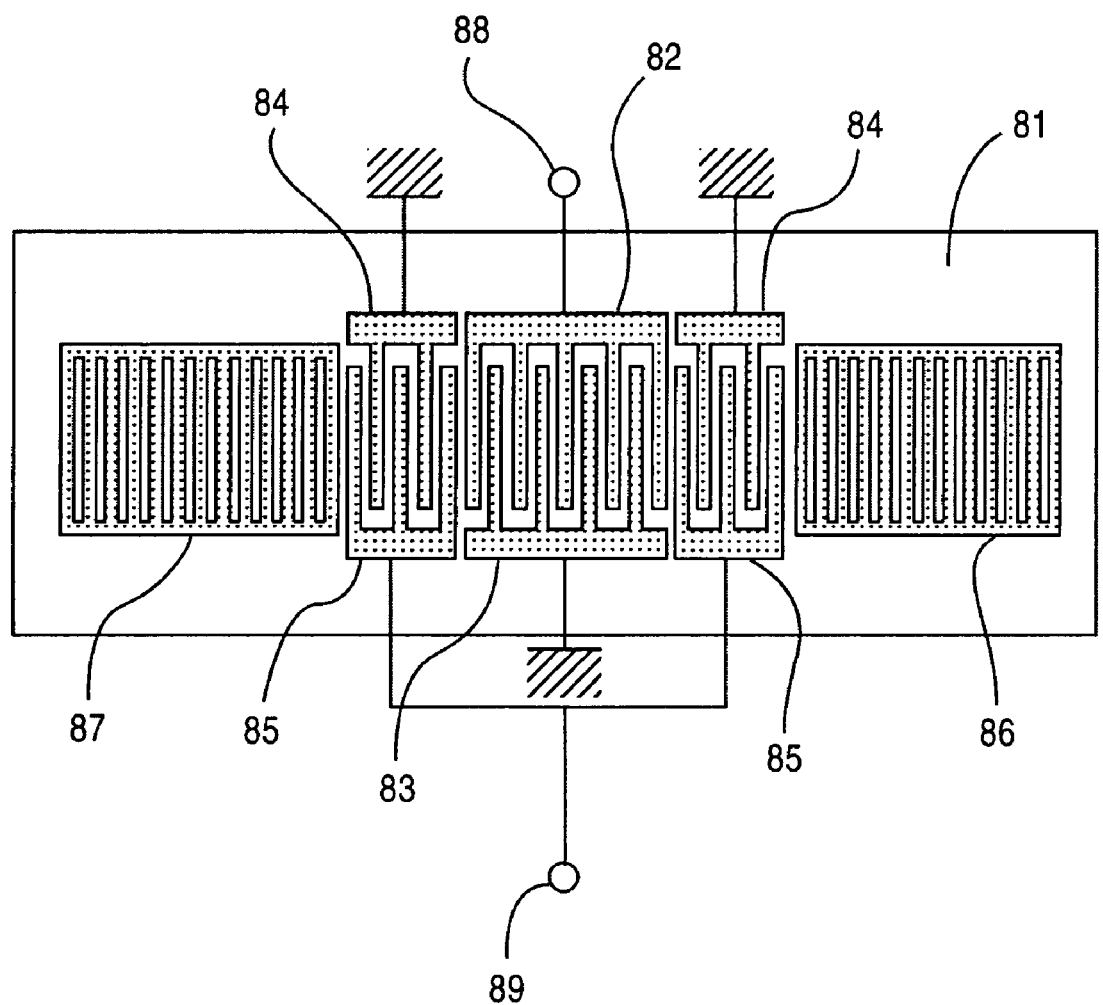
FIG. 9 shows a schematic plane view of the electrode shape of the filter element to which the laminated film structure on the basis of the embodiment of the present invention is adapted.

FIG. 9 is a plane view illustrating the electrode structure of the filter element.

On the substrate 81 formed of the laminated film structure, an input side interdigital transducer 82 consisting of platinum Pt and an output side interdigital transducer 83 also consisting of Pt are grounded with the common wire and reflectors 86, 87 are provided in both sides of such transducers. Moreover, a tap 84 is also provided in the side of the input side interdigital transducer 82, while a tap 85, in the side of the interdigital transducer 83 corresponding thereto. The tap 84 is connected to an input terminal 88 with the wire bonding, while the tap 85, to an output terminal 89 in the same manner. An interval of the comb-type electrodes is 5 μm in the frequency of 800 MHz.

The following manufacturing method can be adapted for obtaining the filter element.

First, the YSZ film 72 (thickness: 200 nm) and SrO film (thickness: 2 nm, not illustrated) are sequentially formed on the silicon substrate 71 as in the case of the third embodiment.

Next, the SrTiO$_3$ film 74 (thickness: 200 nm) is grown with the film forming method which is similar to that for the first embodiment.

Next, the PLZT film 76 (thickness: 200 nm) is grown with the film forming method which is similar to that for the third embodiment.

Next, a lift-off mask (not illustrated) in the shape of comb-type plane is formed, the Pt electrode 77 is deposited with the sputtering method, and thereafter unwanted mask portion is removed.

Next, the substrate is annealed as in the case of the first embodiment.

The filter element of FIG. 8A can be obtained as described above.

Here, for the film showing the piezoelectric characteristic included in this filter element, the piezoelectric film having the simple Perovskite structure may be formed directly on the zirconium oxide epitaxial film and moreover the piezoelectric film may also be formed on the insulating film (for example, SrTiO$_3$ film or the like) of the simple Perovskite structure. The piezoelectric film formed on the SrTiO$_3$ film 74 is not particularly restricted and therefore not only a substance having the simple Perovskite structure but also a substance having the tungsten bronze structure, bismuth layer structure or the like may also be used. When the piezoelectric film of the simple Perovskite structure is further formed, a more accurate filter element can be obtained by utilizing the epitaxial structure of these structures.

Next, an embodiment of the optical switch element will be described.

The optical switch element including a ferroelectric substance is formed of a core layer for transmitting the light, a clad layer having the refractive index which is smaller than that of the core layer for propagating the light through the total reflection at the interface with the core layer, and an electrode giving the electro-optical effect to the ferroelectric substance layer. When the refractive index changes due to the electro-optical effect at a part of the core layer, the light is refracted at the interface thereof and thereby the progressing direction of light can be changed. The embodiments of the optical switch element can take various profiles in accordance with the applications in the case where the air is substituted for a part of the clad layer and the refractive index of the clad layer is changed, without giving any electro-optical effect to the core layer.

Figure 10A:
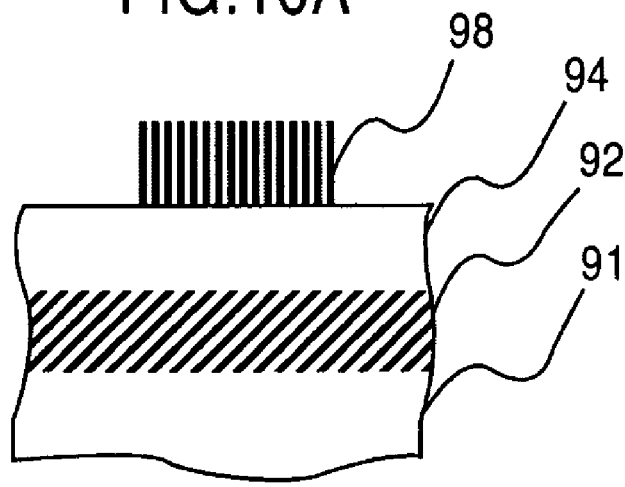
FIGS. 10A and 10B show schematic cross-sectional views of the optical switch element to which the laminated film structure on the basis of the embodiment of the present invention is adapted.
Figure 10B:
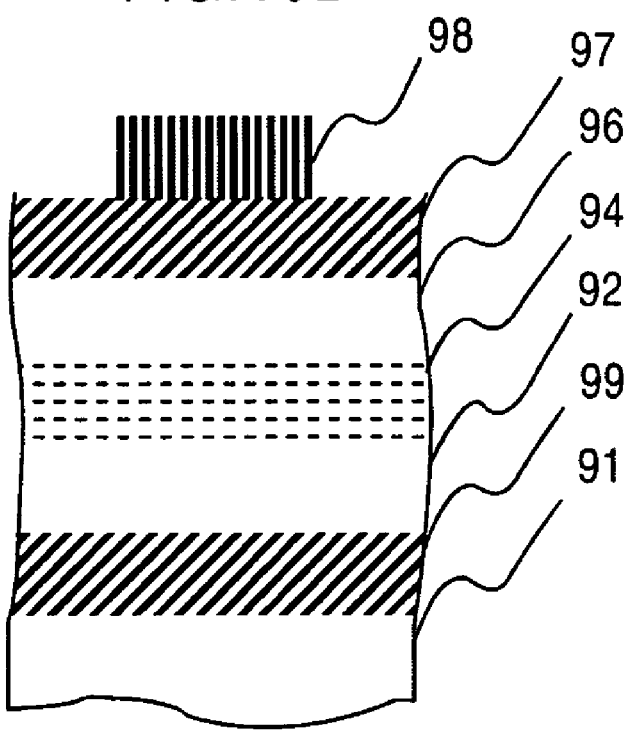

FIGS. 10A and 10B illustrate examples where the laminated film structure of the present invention is adapted to an optical switch element.

FIG. 10A illustrates a schematic cross-sectional view of the optical switch element (No. 1) as the fifth embodiment.

This optical switch element has a structure that the end face (not illustrated) of the core layer is optically polished, and the Pt electrode 98 is provided on the laminated film structure which has been formed by sequentially laminating, on the silicon substrate 91, the YSZ film 92 (thickness: 2000 nm), and PLT (Pb$_{0.7}$La$_{0.2}$TiO$_3$) film 94 where SrO is diffused (thickness: 2000 nm). However, the Pt electrode 98 has the electrode structure showing the triangular plane view.

In order to obtain the optical switch element of the present invention, following manufacturing method, for example, is adapted.

First, the YSZ film 92 (thickness: 2000 nm) and SrO film (thickness: 2 nm, not illustrated) are sequentially formed on the silicon substrate 91 as in the case of the first embodiment.

Next, the heating condition is maintained (at about 650 degree C.) within the chamber evacuated (200 mTorr) for the substrate. Thereafter, while the oxygen gas is introduced (6 cc/min), the PLT film 94 is formed with epitaxial growth on the SrO film (not illustrated) by irradiating (100 minutes) the (Pb, La)TiO$_3$ target with the KrF excimer laser with the pulse laser deposition method. The PLT film 94 is rotated by 45 degrees at the plane (001) for the YSZ film 92, and allows diffusion of the SrO film.

Next, the Pt electrode 98 is formed with the sputtering method, covering the silicon substrate with the metal stencil mask having the triangular plane view.

Next, crystal defect of the PLT film caused by the sputtering method is recovered with the annealing process as in the case of the first embodiment.

Next, after the substrate is cut into the shape of optical switch element, the end face of the light transmitting path (not illustrated) is optically polished with the alumina fine particles for polishing.

The optical switch element of FIG. 10A has been obtained as described above.

For the optical switch element, the simple Perovskite structure oxide/zirconium oxide film structure of the present invention may be used in direct as the waveguide or as the waveguide having the multilayer structure. In order to form the optical waveguide, the thin film structure of two layers or more must be formed and the refractive index of the one film (core layer) for guiding the light must be larger than that of at least the film (clad) provided at the lower part thereof.

An optical path of the transmitting light can be varied by forming the film having the electro-optical effect as the core layer and also forming a lower electrode at the lower part of the clad layer and an upper electrode at the upper part of the core layer in order to apply the electric field to the core layer. For example, when the electrode in the triangular shape is formed as the upper electrode, the electric field in the shape of prism can be applied in the traveling direction of the light. When the electric field is applied as described above, the light path can be varied like the prism effect at the end face where the refractive index has changed in the shape of prism.

Here, it is also possible to introduce the structure that an oxide film having the simple Perovskite structure (for example, SrTiO$_3$ film) formed on the YSZ via an oxide of the rock salt structure is used as the clad layer, while the core layer (for example, PLZT) having a refractive index which is larger than that of the clad layer and also having the electro-optical effect is formed.

In view of improving the crystal property of the YSZ film, the silicon oxide film may be formed at the interface of the silicon substrate and YSZ substrate with the heat treatment while the oxygen gas or vapor is introduced before the formation of the oxide film having the simple Perovskite structure. When the silicon oxide film having no plane for alignment is formed at the interface, the YSZ film under the control of the substrate is now capable of conducting self-reallocation owing to the heat thereof and thereby the crystal property thereof can be improved. When the crystal property of YSZ film is improved, the crystal property of all epitaxial films formed on the YSZ film can also be improved and crystal defect thereof can also be lowered by succeeding the crystal property of the YSZ film. Accordingly, optical loss thereof can be lowered.

When a silicon thermal oxide film is formed at the interface between the YSZ film and the silicon substrate, if the silicon substrate is used as the lower electrode, the optical waveguide and the silicon thermal oxide film are connected in series. Accordingly, the greater part of voltage is applied to the silicon oxide film having low dielectric constant and the voltage is not easily applied to the core layer. This problem may be eliminated by forming a conductive metal or an oxide to the lower part of the oxide layer used as the waveguide. Here, it is possible to provide the structure that a conductive oxide such as $SrRuO_3$ is formed to the epitaxial film of the simple Perovskite structure formed on the YSZ via the oxide of rock salt structure and the clad layer and core layer are formed on this conductive oxide. Moreover, it is also possible to provide the structure that a conductive oxide or metal film such as platinum and iridium is formed with epitaxial growth to the upper layer of the epitaxial film, for example, the $SrTiO_3$ film of the simple Perovskite structure formed on the YSZ via the oxide of the rock salt structure, and the optical waveguide layer is provided on this upper part of such upper layer.

Since many oxides have the refractive indices which are larger than that of the air, when two layers of clad layer and core layer are provided in minimum, the air at the upper layer of the core layer plays the role of the clad layer. As a result, such oxide can be operated as the optical waveguide. In this case, the upper electrode layer is formed just above the core layer. When a substance having the refractive index which is larger than that of the core layer is used as the upper electrode, the transmitting light is attenuated due to the influence of the upper electrode. In view of preventing such attenuation of transmitting light, it is also possible to further form the clad layer having the refractive index smaller than that of the core layer as the upper layer of the core layer. The structure including such clad layer as the upper layer can be adapted to any structure of the optical switch element.

In order to form the optical waveguide structure of three layers consisting of the clad layer-core layer-clad layer by utilizing the structure of the simple Perovskite structure which is formed with epitaxial growth through rotation in the plane of 45 degrees at the plane (001) for the epitaxial YSZ film on the silicon substrate, the refractive index of the core layer must be larger than that of the clad layer. The three-layer structure of the clad layer-core layer-clad layer may be formed completely with the oxides having different crystal structures, but it is preferable in the point for preventing deterioration of the crystal property that the hetero-epitaxial structure is formed with the substance having the identical crystal structure for three layers. As the material of the core layer, it is preferable to use PZT and $(Sr,Ba)Nb_2O_6$(SBN) having the large electro-optical effect. Or, it is also possible to form, by adding, for example, an additive to the PZT, the film having the compositions such as $(Pb_{1-y}La_{3/2y})(Zr_{1-x}Ti_x)O_3$, $(Pb(B'_{1/3}B''_{2/3})_xTi_yZr_{1-x-y}O_3$ ($0 \leq x, y \leq 1$, B' is a bivalent transition metal, B" is a pentavalent transition metal), $Pb(B'_{1/2}B''_{1/2})_xTi_yZr_{1-x-y}O_3$ ($0 \leq x, y \leq 1$, B' is a trivalent transition metal, B" is a pentavalent transition metal), $(Pb(B'_{1/3}B''_{2/3})_xTi_yZr_{1-x-y})3$ ($0 \leq x, y \leq 1$, B' is a hexavalent transition metal, B" is a trivalent transition metal). When the PZT is used as the core layer, $(Ba_xSr_{1-x})TiO_3$ ($0 \leq x, y \leq 1$), $(Pb_{1-y}La_{3/2y})(Zr_{1-x}Ti_x)O_3$ ($0 \leq x, y \leq 1$), for example, having the identical crystal structure and small refractive index may be used.

Next, the optical switch element using the laminated film structure (No. 2) of the present invention will be described as the sixth embodiment.

FIG. 10B is a schematic cross-sectional view of the optical switch element (No. 2).

The optical switch element (No. 2) has a structure that the end face thereof is optically polished and the Pt electrode 98 is provided to the laminated film structure formed by laminating, on the silicon substrate 91, a silicon oxide film 99 (thickness: 100 nm), a YSZ film 92 (thickness: 200 nm), a $SrRuO_3$ film 94 (thickness: 100 nm) where SrO is diffused, a barium strontium titanate (hereinafter, described as (Ba,Sr)$TiO_3$) film 96 (thickness: 2000 nm), and a PZT film 97 (thickness: 2600 nm). However, the Pt electrode 98 includes electrode structure having the triangular plane view.

In order to obtain the optical switch element (No. 2) of the present invention, the following manufacturing method can be adapted.

First, like the first embodiment, a YSZ film 92, a silicon oxide film 99, a $SrRuO_3$ film 94, and a SrO film (not illustrated) are formed on the silicon substrate 91. The $SrRuO_3$ film 94 is grown through rotation of the plane (001) for 45 degrees within the plane for the YSZ film 92 and the SrO film is fetched during the growth thereof.

Next, the heating condition is maintained (650 degree C.) within the chamber evacuated (10 mTorr) for the substrate. Thereafter, while the oxygen gas is introduced (6 cc/min), the (Ba, Sr)$TiO_3$ film 96 is formed with epitaxial growth to obtain the predetermined thickness by irradiating the target of the barium strontium titanate with the KrF excimer laser with the pulse laser deposition method.

Next, the PZT film 97 is formed with the chemical solution deposition method (hereinafter described as CSD method) First, the PZT solution (composition: PZT 52/48, concentration: 17 wt %) is dropped on the substrate and it is then spin-coated (3000 rpm, 20 seconds). After the solvent is vaporized (5 minutes) on the hot plate (previously heated up to 140° C.), the solution is thermally decomposed (5 minutes) on the hot plate (previously heated up to 350 degree C.) and it is then cooled to the room temperature. Thereafter, the rapid thermal annealing (hereinafter, described as RTA) is conducted (650 degree C., 10 minutes) under the environment of oxygen gas (5000 cc/min) to obtain the crystallized PZT film (thickness: 200 nm). Formation of this PZT film is repeated for 13 times to obtain the PZT film 97 in the final thickness of 2600 nm.

Next, the Pt electrode 98 is formed as in the case of the fifth embodiment and the annealing is then conducted. With the process and polishing into the shape of an optical element, the optical switch element (No. 2) of FIG. 10B can be obtained.

Next, as the seventh embodiment, the optical switch element (No. 3) using the laminated film structure of the present invention will be described.

Figure 11:
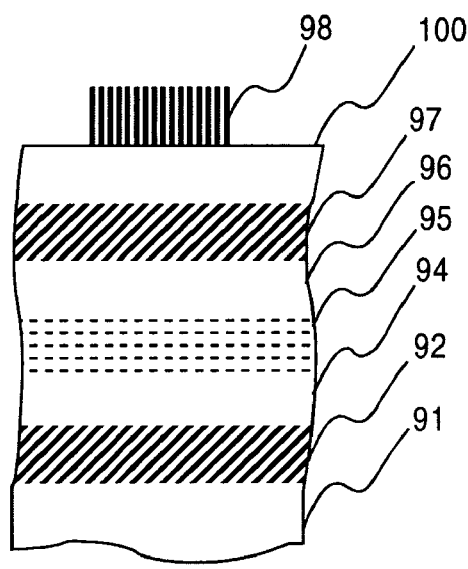
FIG. 11 shows a schematic cross-sectional view of the optical switch element to which the laminated film structure on the basis of the embodiment of the present invention is adapted.

FIG. 11 is a schematic cross-sectional view of the optical switch element (No. 3).

The optical switch element (No. 3) has a structure that the light inputting surface (not illustrated) and the light outputting surface (not illustrated) are optically polished and the Pt electrode 98 is provided on the (001) silicon single crystal substrate 91 on which a YSZ film 92 (thickness: 200 nm), a $SrTiO_3$ film 94 where SrO is diffused (thickness: 200 nm), a Pt film 95 (thickness: 200 nm), a PLZT film 96 (thickness: 2200 nm), a PZT film 97 (thickness: 2600 nm), and a PLZT film 100 (thickness: 2200 nm) are sequentially stacked. However, the Pt electrode 98 has the electrode structure having the triangular plane view.

In order to obtain the optical switch element (No. 3) the following manufacturing method will be adapted.

First, the YSZ film 92, SrO film (not illustrated), and SrTiO film 94 are formed in the predetermined thickness using the substrate and the film forming method as in the case of the third embodiment. The SrTiO$_3$ film 94 is rotated within the plane for 45 degrees at the plane (001) for the YSZ film 92 and grown with the epitaxial growth method in the alignment at the plane (001) extracting the SrO film.

Next, with the film forming method indicating in the third embodiment, the Pt film 95 (thickness: 200 nm) is grown with the epitaxial growth method.

Next, the PLZT film 96 is formed with the CSD method. First, the crystallized PLZT film (thickness: 200 nm) is obtained with the heat treatment which is similar to the process to form the PZT film 97 indicated in the third embodiment, except for the use of the PLZT solution (composition: PLZT 1/3/9/65/35; concentration: 17%). The PLZT film 96 in the thickness of 2200 nm is obtained by repeating this PLZT film forming process for 11 times. This layer is used as the lower clad layer.

Next, with the CSD method, the PZT film 97 is formed as in the case of the film forming method indicated for the sixth embodiment. This layer is used as the core layer.

Next, with the CSD method, the PLZT film 100 is formed as in the case of the film forming method indicated for the lower clad layer. This layer is used as the lower clad layer.

Next, the Pt electrode 98 is formed as in the case of the fourth embodiment. The annealing is then conducted. With the process and optical polishing of the end face (not illustrated) into the shape of an optical element, the optical switch element (No. 3) of FIG. 10C can be obtained.

Operation principle of the optical switch element (No. 3) illustrated in FIG. 11 will be described with reference to FIG. 12.

Figure 12:
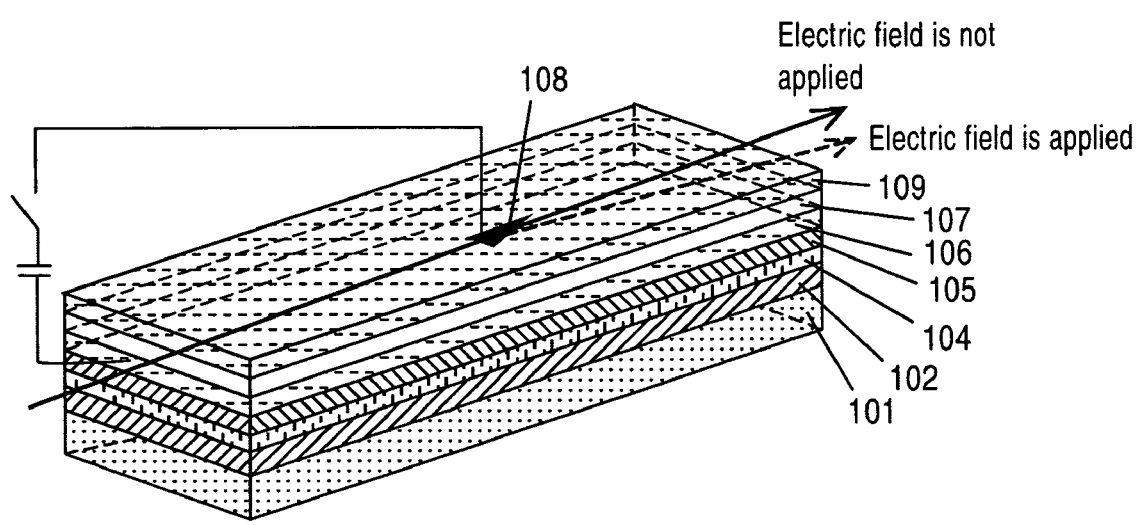
FIG. 12 shows a schematic cross-sectional view of the optical switch element to which the laminated film structure on the basis of the embodiment of the present invention is adapted.

In FIG. 12, numeral 101 designates a silicon substrate; 102, a YSZ film; 104, a SrTiO$_3$ film where the SrO film is diffused; 105, a Pt film; 106, a PLZT film (clad layer); 107, a PLT film (core layer); 108, an upper electrode; and 109, a PLZT film (clad layer). In this figure, the transmitting light inputted from the left end face of the optical switch element goes straight to the right end face when the electric field is not applied. However, the transmitting light is capable of changing the optical path in accordance with the refractive index changing region on which the upper electrode shape is reflected at the core layer 107 in which the refractive index changes, when the electric field is applied to a Pt film 105 and upper electrode 108.

The electronic element based on the embodiments of the present invention has been described, but the present invention is not restricted thereto. Namely, the present invention can be adapted to various electronic elements including the ferroelectric laminated film structure which changes when the vertical electric field is applied to the single crystal silicon substrate aligned to the plane (001).

What is claimed is:

1. An electronic element, comprising:
   a (001) single crystal substrate having a plane (001) on a surface,
   a first film which is formed with epitaxial growth on the (001) single crystal substrate, and
   a second film including a simple Perovskite structure which has been grown with a plane (001) rotated within a plane in contact with the first film in accordance with an inherent rotating angle of the first film.

2. The electronic element as claimed in claim 1, wherein the second film comprises an alkaline earth metal oxide.

3. The electronic element as claimed in claim 2, wherein the alkaline earth metal oxide comprises at least any one of SrO and CaO.

4. The electronic element as claimed in claim 1, wherein the second film is grown with rotation in the plane (001) substantially for 45 degrees within the plane in contact with the first film.

5. The electronic element as claimed in claim 1, wherein the first film includes zirconium oxide.

6. The electronic element as claimed in claim 1, wherein the first film includes a rare earth element.

7. The electronic element as claimed in claim 6, wherein the rare earth element is at least any one of Sc, Ce, Y, Pr, Nd, Eu, Tb, Dy, Ho, Yb, Y, Sm, Gd, Er, and La.

8. The electronic element as claimed in claim 1, wherein the first film includes an alkaline earth element.

9. The electronic element as claimed in claim 8, wherein the alkaline earth element includes at least any one of Mg, Ca, Sr, and Ba.

10. The electronic element as claimed in claim 1, wherein the (001) single crystal substrate is formed of silicon.

11. The electronic element as claimed in claim 1, wherein the second film includes at least anyone of SrRuO$_3$, CaRuO$_3$, LaNiO$_3$, (La$_x$Sr$_{1-x}$)CoO$_3$ (0≦x≦1), (La$_x$Sr$_{1-x}$)MnO$_3$ ((0≦x≦1), CaTiO$_3$, (Ba$_x$Sr$_{1-x}$)TiO$_3$ (0≦x≦1).

12. An optical switch element comprising:
   a (001) single crystal substrate;
   a first film which is grown with epitaxial growth on a surface of the (001) single crystal substrate;
   a second film including a simple Perovskite structure which has been grown by rotating a plane (001) within a plane in contact with the first film in accordance with an inherent rotating angle of the first film; and
   a third film including a platinum group structure on the second film.

13. The optical switch element as claimed in claim 12, wherein the second film is grown by rotating the plane (001) substantially for 45 degrees within the plane in contact with the first film.

14. The optical switch element as claimed in claim 12, wherein the third film includes at least platinum, iridium or a mixture thereof.

15. The optical switch element as claimed in claim 12, wherein laminated films of different refractive indices are formed on the third film.

16. The optical switch element as claimed in claim 15, wherein at least one layer of the laminated films has the simple Perovskite structure.

17. The optical switch element as claimed in claim 16, wherein the laminated film includes at least any one of the Pb(Zr$_{1-x}$Ti$_x$)O$_3$ (0≦x≦1), (Pb$_{1-y}$La$_{3/2}$y)(Zr$_{1-x}$Ti$_x$)O$_3$ (0≦x, y≦1), Pb(B'$_{1/3}$B"$_{2/3}$)Ti$_y$Zr$_{1-x-y}$O$_3$ (0≦x, y≦1, B' is a bivalent transition metal, B" is a pentavalent transition metal), Pb(B'$_{1/2}$B"$_{1/2}$)$_x$Ti$_y$Zr$_{1-x-y}$O$_3$ (0≦x, y≦1, B' is a trivalent transition metal, B" is a pentavalent transition metal), Pb(B'$_{1/3}$B"$_{2/3}$)$_x$Ti$_y$Zr$_{1-x-y}$O$_3$ (0≦x, y≦1, B' is a hexavalent transition metal, B" is a trivalent transition metal).

18. The optical switch element as claimed in claim 15, wherein at least one layer of the laminated films has a tungsten bronze structure.

19. The optical switch element as claimed in claim 18, wherein the laminated film includes at least any one selected from the group consisting of (Sr$_{1-x}$Ba$_x$)Nb$_2$O$_6$ (0≦x≦1), (Sr$_{1-x}$Ba$_x$)Ta$_2$O$_6$ (0≦x≦1), PbNb$_2$O$_6$ (0≦x≦1), and Ba$_2$NaNb$_5$O$_{15}$.

20. The optical switch element as claimed in claim 15, wherein at least one layer of the laminated films has a bismuth layer structure.

21. The optical switch element as claimed in claim 20, wherein the laminated films include at least any one selected from the group consisting of $(Bi_{1-x}R_x)_4Ti_3O_{12}$ (R is a rare earth element, $0 \leqq x \leqq 1$), $SrBi_2Ta_2O_9$, and $SrBi_4Ti_4O_{15}$.

* * * * *